Figure 1:
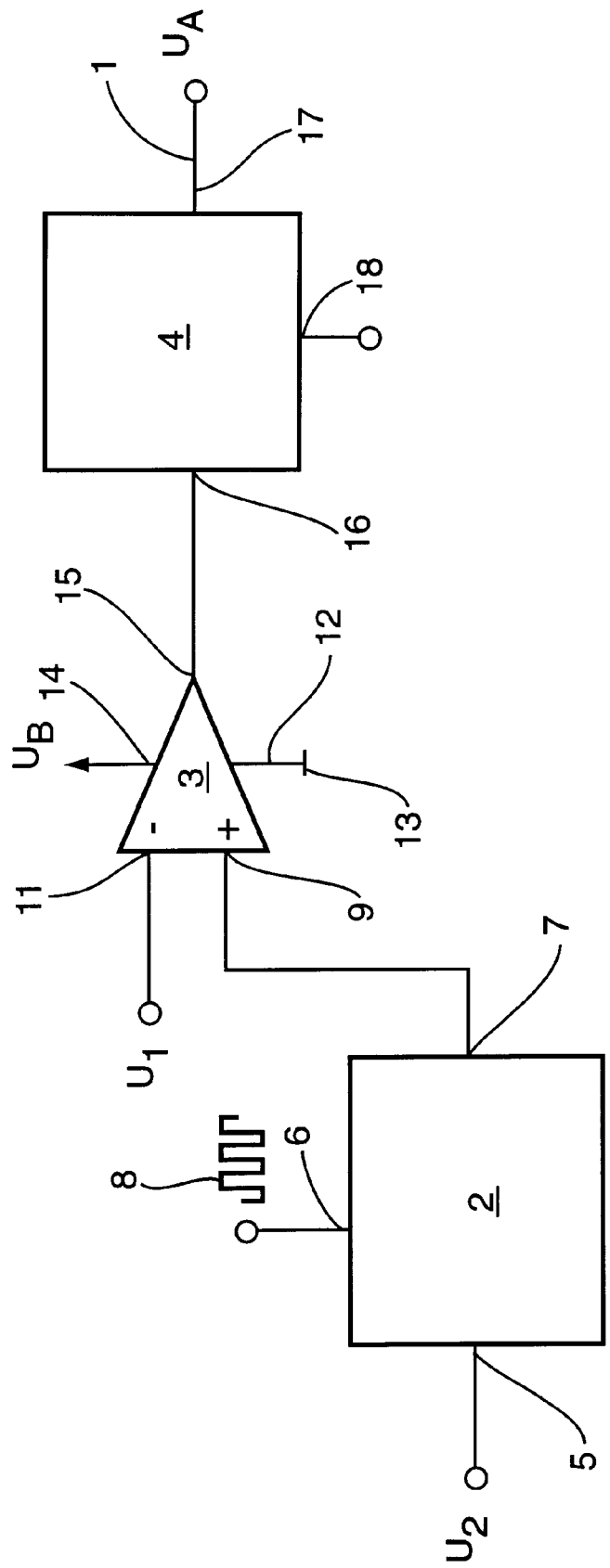
Figure 2:
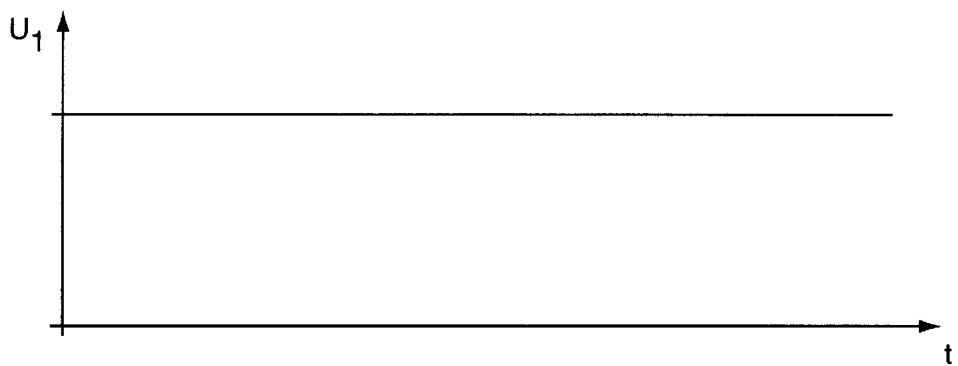

United States Patent
Schwenkel et al.

[19]

[11] Patent Number: 5,936,435
[45] Date of Patent: Aug. 10, 1999

[54] VOLTAGE COMPARATOR AND MONITOR

[75] Inventors: Hans Dieter Schwenkel, Stuttgart; Christoph Weishaar, Waiblingen, both of Germany

[73] Assignee: Pilz GmbH & Co., Germany

[21] Appl. No.: 08/849,780

[22] PCT Filed: Dec. 6, 1995

[86] PCT No.: PCT/DE95/01730

§ 371 Date: Jun. 9, 1997

§ 102(e) Date: Jun. 9, 1997

[87] PCT Pub. No.: WO96/18107

PCT Pub. Date: Jun. 13, 1996

[30] Foreign Application Priority Data

Dec. 9, 1994 [DE] Germany .............................. 44 43 862

[51] Int. Cl.[6] .................................................. H03K 5/153
[52] U.S. Cl. ............................... 327/78; 327/77; 327/361
[58] Field of Search ................................ 327/77, 78, 56, 327/80, 172, 175, 538, 540, 355, 361

[56] References Cited

U.S. PATENT DOCUMENTS 3,612,975  10/1971  Keefe ....................................... 318/599
5,491,445  2/1996   Moller et al. .......................... 327/540
5,666,075  9/1997   Schinzel ................................... 327/78

*Primary Examiner*—Timothy P. Callahan
*Assistant Examiner*—Jung Ho Kim
*Attorney, Agent, or Firm*—Leydig, Voit & Mayer, Ltd.

[57] ABSTRACT

A device for comparing two DC voltages ($U_1$, $U_2$) comprises a voltage comparator (3) having two inputs (9, 11). One of the two voltages ($U_1$, $U_2$) to be compared to each other is fed directly into one of the inputs (9, 11). The other voltage enters a voltage-conversion device (2) in which the voltage to be compared is superimposed with the DC voltage (8) so that a DC voltage arises at the output (7) of the voltage-conversion device (2), which voltage periodically fluctuates back and forth between an upper and a lower amplitude value in the cycle of the square-wave signal (8). The distance between the two amplitude values corresponds to the tolerance band within which the two voltages ($U_1$, $U_2$) to be compared with one another must be identical. The voltage signal obtained from the voltage-conversion circuit (2) enters the other input (9) of the voltage comparator (3), which then only supplies an AC signal at its output (15) if the upper amplitude value is greater than and the lower amplitude value is smaller than the DC signal fed into the other input (11) of the comparator (3).

24 Claims, 6 Drawing Sheets

VOLTAGE COMPARATOR AND MONITOR

The more automated the individual processes in modern systems become, the greater a priority it is to design these processes to be as safe as conceivable. Safety cannot be compromised by disturbances of individual components. Likewise, if such components break down, these problems must be detected before they lead to dangerous situations.

One critical point in this matter is the supply voltage of electronic controls that are used for process management and supervision. Today, these types of controls are generally digital controls that only operate within a relatively small supply voltage range per their specifications. If the supply voltage becomes too high, the components face the threat of a breakdown due to excessive voltage or too much dissipated heat. These damages are irreversible and cause major repair expenditures.

In contrast, if the supply voltage falls below critical values, the signal-to-interference ratio in the circuit is decreased, i.e., the switching thresholds can be accidentally exceeded or not met due to outside interfering signals, which transgressions in turn cause control errors. Further, the signal differentiation can become unsafe with a supply voltage that is too low. An unsafe differentiation could lead to an erroneous switching of the two digital signals zero and one.

Window comparators are used, for example, for checking whether a voltage is within a specified tolerance window. In this type of comparison, a reference voltage that is essentially independent of the supply voltage is fed into a comparator input. The voltage to be compared to this voltage is rectified, if it is not already present as a DC voltage, and then supplied to the other comparator input. The comparator output signal is a function of the comparison, and assumes, for example, the value of one if the monitored signal is within the tolerance window, and changes to the zero state as soon as the monitored signal goes out of the tolerance window.

This type of circuit is, however, insufficiently safe because errors in the comparator itself can lead to a constant voltage at the comparator's output, which simulates one of the two possible comparison statuses.

Based on this, it is the object of the invention to create an apparatus for comparing two voltages to one another, with the output signal of the device having a very high degree of reliability.

The novel apparatus does not compare the two DC voltages directly with the aid of a comparator; instead, one of the two voltages to be compared enters a voltage-conversion device, which creates a voltage from the DC voltage supplied, which voltage is superinposed by an AC voltage. The signal present at the output of the voltage-conversion device is thus a DC-voltage signal having an AC component, i.e., an AC-voltage signal that is shifted with respect to DC-voltage level. The signal at the output of the voltage-conversion device, therefore, fluctuates back and forth periodically between an upper amplitude value and a lower amplitude value, with the distance between the two amplitude values being a predetermined differential value. This differential value can be made to equal the window within which one of the voltages to be monitored should move.

The signal modified in this manner enters the other comparator input, which then and only then emits an AC signal at its output if the AC signal fed in is periodically larger or smaller than the continuous signal fed into the other input. For example, if the DC voltage supplied to the voltage-conversion device becomes too large, then, with corresponding dimensioning, the lower amplitude value increases to a value greater than the comparison voltage, whereupon the comparator emits a continuous-wave signal at the output. The same applies if the voltage supplied to the voltage-conversion device is too small, because then the output signal of the device cannot become larger than the other signal fed into the comparator. Thus, the occurrence of an AC signal at the comparator output is a sure sign that the two voltages to be compared to one another are identical based on a specified tolerance range.

If components malfunction within the monitoring circuit, this can lead to the comparator releasing a continuous-wave signal at its output and the AC signal remaining off. A malfunction of components can practically never lead to an AC signal at the comparator output, which is why the novel apparatus ensures a very high degree of safety.

The voltage-conversion device works like a summation circuit, as it were, in which an AC signal is added to the voltage to be monitored, with half of the signal's peak-to-peak value being smaller in amount than the supplied voltage. The peak-to-peak value corresponds essentially to the tolerance window within which the voltage value should fall.

With the novel apparatus, it is irrelevant whether the reference value is fed directly to the comparator and the monitored voltage is fed into the voltage-conversion device or whether the two voltages are exchanged with one another.

Depending on whether the nominal value is symmetrical in the tolerance window or is shifted to one side, the average value of the output voltage can be shifted accordingly by superimposing a correction element.

If the intention is to monitor a supply voltage with the novel apparatus, a voltage can be generated from the supply voltage, the size and change of which are proportional to the supply voltage, or a derived voltage can be generated that is smaller than the supply voltage by a constant term; however, in this instance, the changes in the derived voltage are equal in amount to the supply voltage changes. This type of voltage can be generated, for example, by means of a resistor and a Zener diode, with the derived voltage being tapped at the resistor and the supply voltage being applied to the series connection of the resistor and the Zener diode. The high sensitivity of this type of connection is advantageous, because changes in the supply voltage are not divided among the components.

If the aforementioned connection is reversed, i.e., the output voltage is tapped at the Zener diode, then a reference voltage can simply be derived from the supply voltage, the reference voltage being predominantly independent of the supply voltage as long as the supply voltage is larger than the conduction voltage of the Zener diode.

If the signal-conversion device has a corresponding circuit design, it can simultaneously be used to obtain the reference voltage, for example, in that it includes one or a plurality of components having a Zener-diode characteristic between its output and a switching ground common to it and the comparator. The necessary output voltage can be achieved by periodically switching on and off an element that is connected in the series and produces a voltage drop.

If the supply voltage arrives at the output of the signal-conversion device via an element having a Zener-diode characteristic, and the output is switched to ground by way of a resistor-diode combination, the desired pulsing DC voltage is achieved in that an electronic switch that is periodically switched on and off by the square-wave signal is parallel to the elements switched to ground.

In both cases, digital circuits having a so-called open-collector output can be used.

It is, however, also possible to generate the desired signal with the aid of the complementary end stage, as is present in many digital circuits. In this case, a small voltage component is periodically added to the output signal via the end stage of the digital circuit and an additional resistor. With this measure, no special requirements are made of the adder, i.e., a simple interconnection by way of resistors is sufficient.

A voltage converter that generates a system-foreign voltage is connected to the comparator output to make the signal recognition for the subsequent circuit, which evaluates the comparison signal, particularly safe. "System-foreign" here means a voltage that cannot be derived from the normal supply voltage, which is monitored by means of the novel apparatus, through the occurrence of short circuits in the supply voltage. The so-called 'system-foreign' voltage is thus a voltage that is larger than the maximum allowable supply voltage or smaller than the smallest supply voltage occurring in the error case with respect to operational sign and amount, for example for bipolar current supply. Another possible system-foreign voltage is a galvanically-separated voltage. The larger or smaller voltage according to amount and operational sign can be generated very easily by means of a multiplier circuit similar to a Villard circuit, while the galvanically-separated voltage is generated with the aid of a transformer. The transformer can be connected directly to the transformer output, or via an active intermediate circuit, if the output power of the comparator is insufficient to actuate the transformer.

Finally, it can also be advantageous to incorporate the clock frequency into the monitoring to assure even greater safety. This frequency monitoring is achieved in the simplest cases by means of a series resonant circuit, which has the distinct advantage of being particularly safe.

Additionally, modifications of the invention are the subject of the secondary claims.

Figure 6:
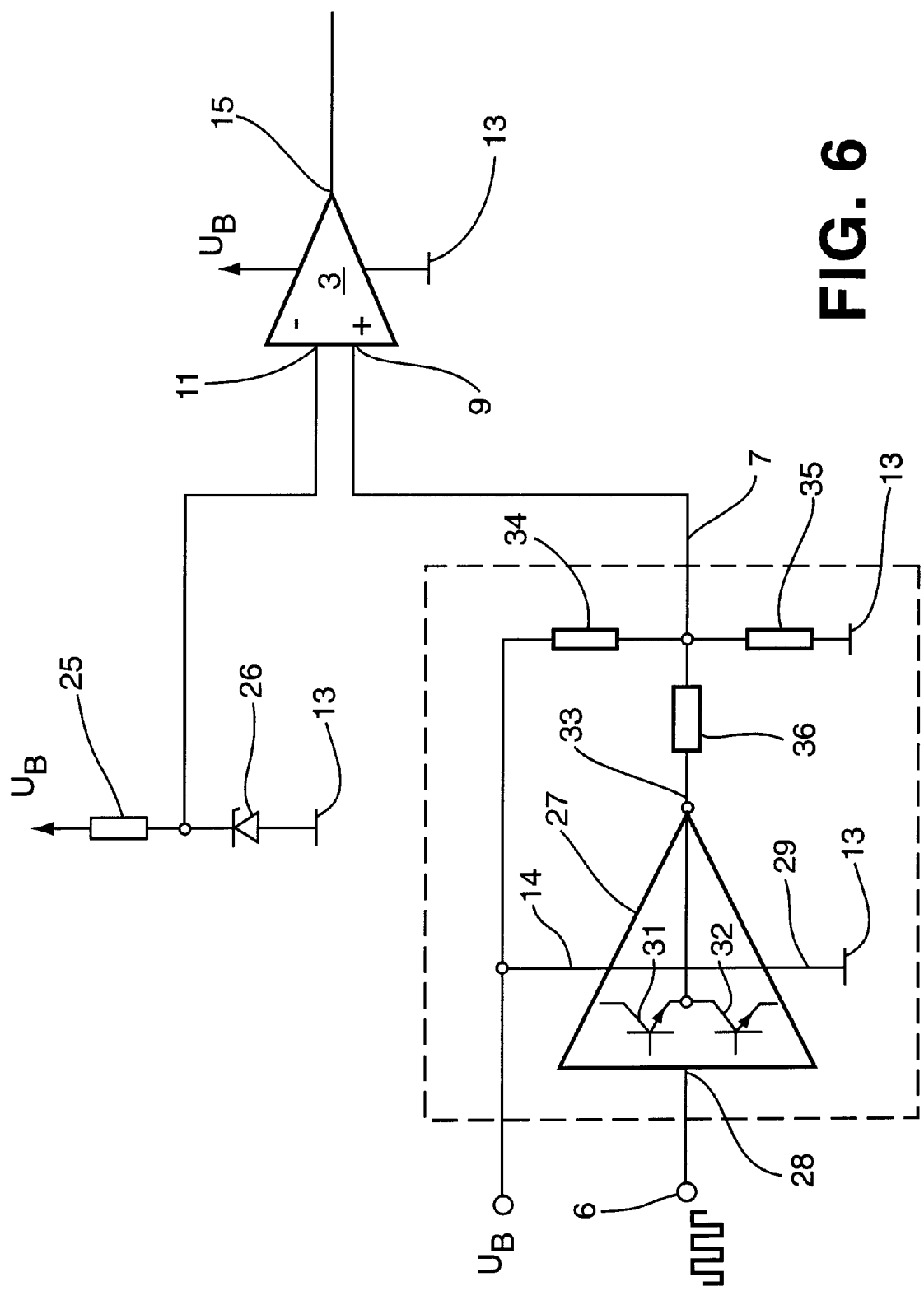
Figure 7:
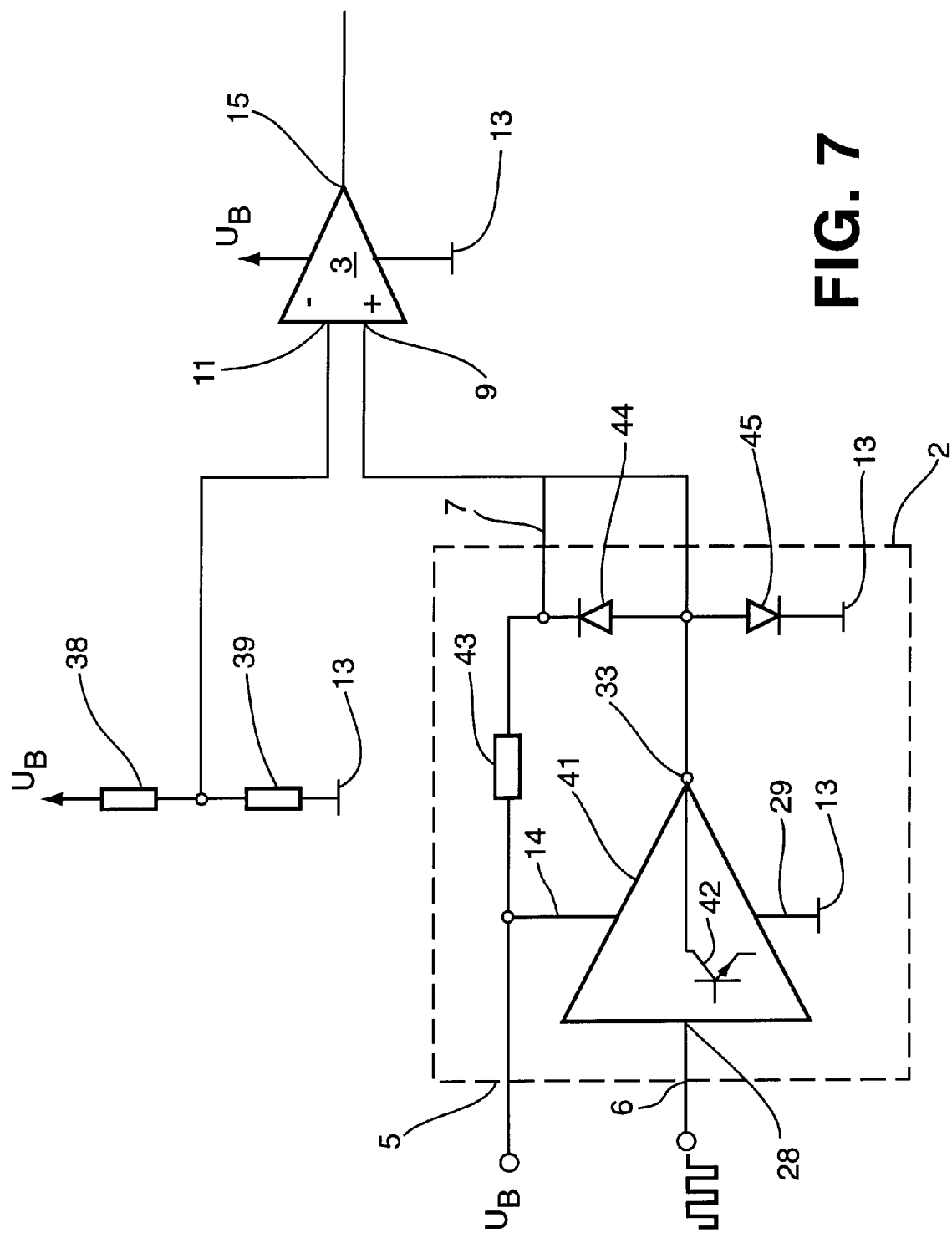
Figure 8:
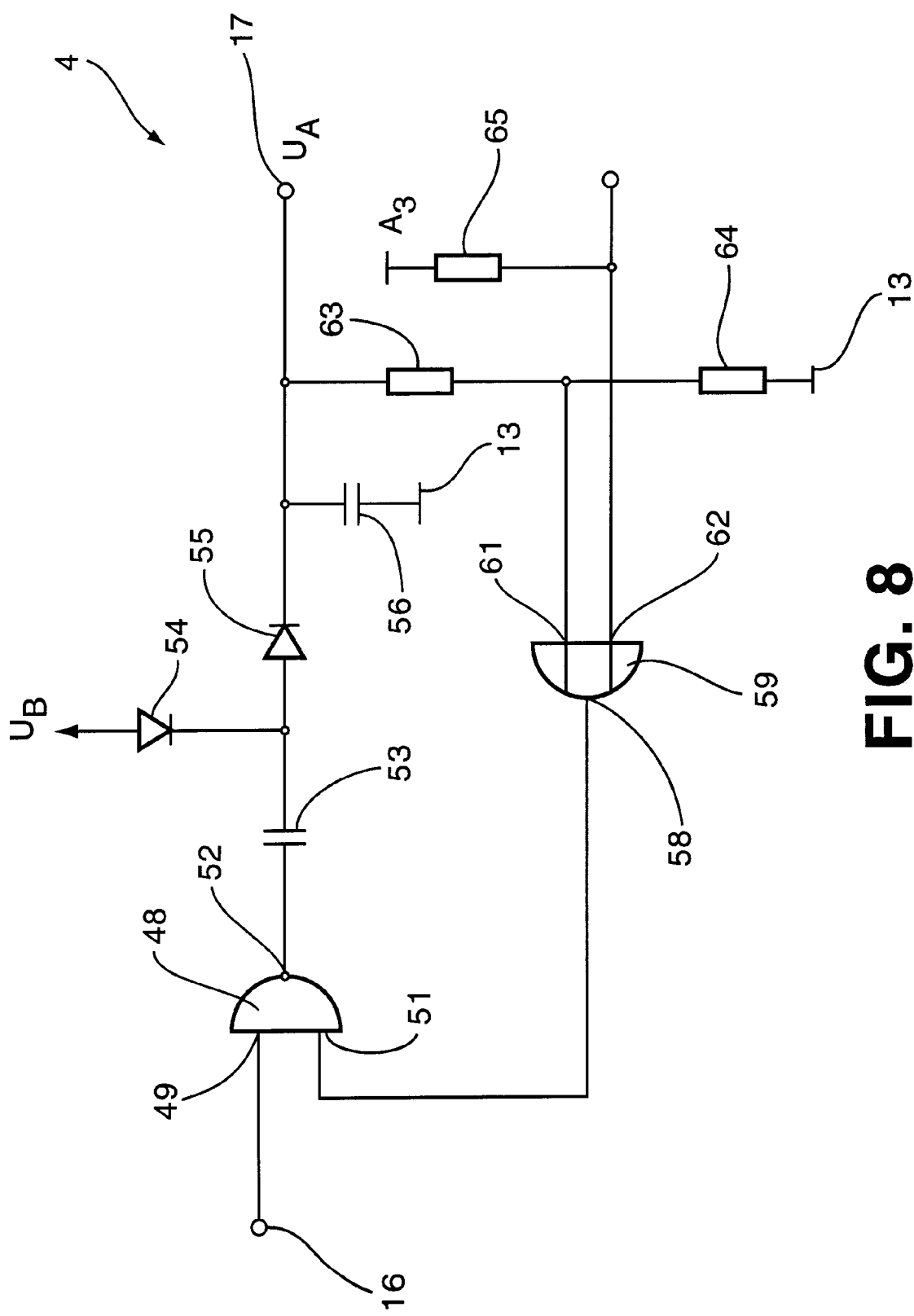
Figure 9:
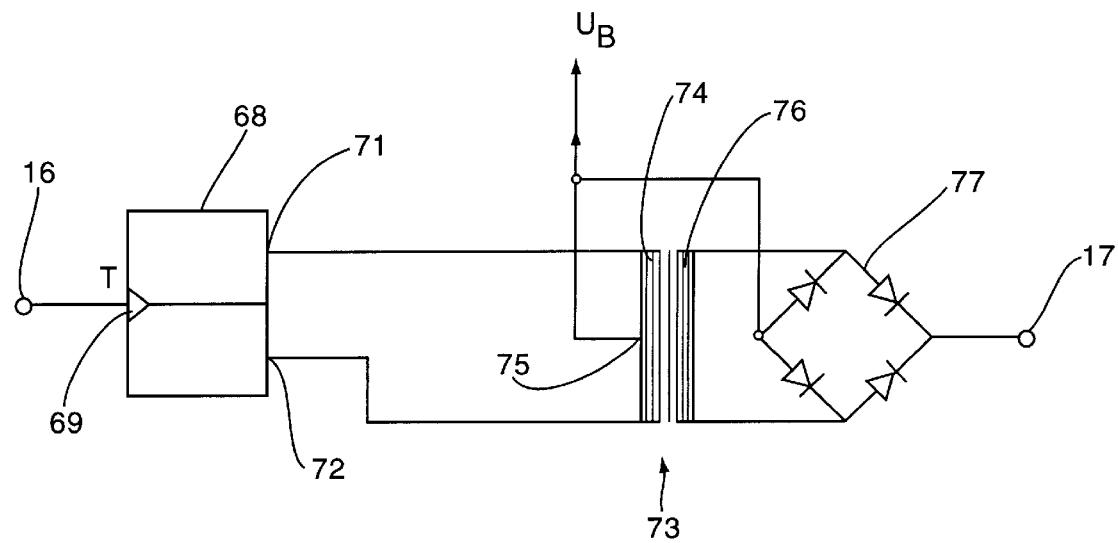

The invention is described by way of embodiments illustrated in the drawings. Shown are in:

FIG. 1: A block diagram of the apparatus for comparing two DC voltages,

FIGS. 2 to 5: The temporal courses of different voltages at different points of the apparatus shown in FIG. 1;

FIG. 6: A more detailed view of an embodiment of the apparatus shown in FIG. 1;

FIG. 7: Another embodiment of the apparatus shown in FIG. 1, likewise depicting the circuit in greater detail;

FIG. 8; An embodiment for the voltage converter of the apparatus shown in FIG. 1;

FIG. 9: Another embodiment for the voltage converter of the apparatus shown in FIG. 1; and FIG. 10: A fundamental circuit diagram of a frequency detector.

FIG. 1 shows an apparatus that is provided for comparing a first DC voltage $U_1$ to a second voltage $U_2$ and emitting a system-foreign voltage $U_A$ at an output 1 if the two DC voltages $U_1$ and $U_2$ are of equal size based on a permissible tolerance range.

The apparatus 1 includes as essential circuit blocks a voltage-conversion circuit 2, a voltage comparator 3 and a voltage converter 4. Voltage-conversion circuit 2 has a signal input 5, a control input 6 and an output 7. A square-wave voltage 8 supplied by a square-wave generator, not shown in detail, is fed into control input 6. Output 7 of voltage-conversion circuit 2 is connected to a non-inverting input 9 of comparator 3, whose inverting input 11 is acted upon by the first DC voltage $U_1$. The second voltage $U_2$ to be compared to voltage $U_1$ enters input 5 of voltage-conversion circuit 2.

Voltage comparator 3 is connected by means of a connection 12 to a joint circuit ground 13, while it receives its supply voltage $U_9$ from a joint voltage source at a connection 14. Its output 15 is connected to an input 16 of voltage converter 4, whose output 17 simultaneously represents output 1 of the entire apparatus. If need be, voltage converter 4 can be additionally provided with an enable or release input 18.

To explain in detail the operation of the apparatus in accordance with FIG. 1, reference will be made to FIGS. 2 through 5. As evident in FIG. 2, DC voltage $U_1$ is a voltage that is invariant over time, and may represent the reference voltage to which voltage $U_2$ is compared.

Figure 3:
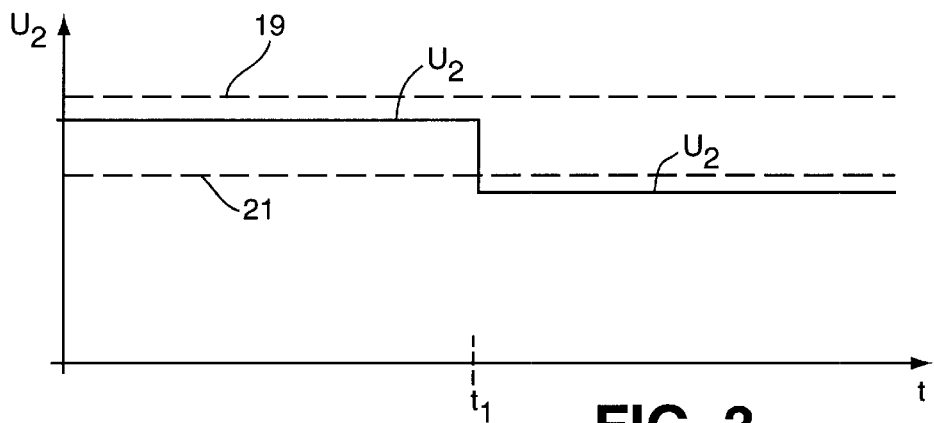

The course of voltage $U_2$ is illustrated in FIG. 3. Until time $t_1$, this voltage $U_2$ has a nominal value $U_{2nom}$. At time $t_1$, an error occurs for $U_2$, which leads to a drop in $U_2$ to a value $U_{2error}$. This value $U_{2error}$ is smaller than an allowable tolerance band within which $U_2$ may move without any disturbance occurring. The upper limit of this tolerance band is indicated by a dashed line 19 in FIG. 3, and the lower limit is indicated by a dashed line 21.

Figure 4:
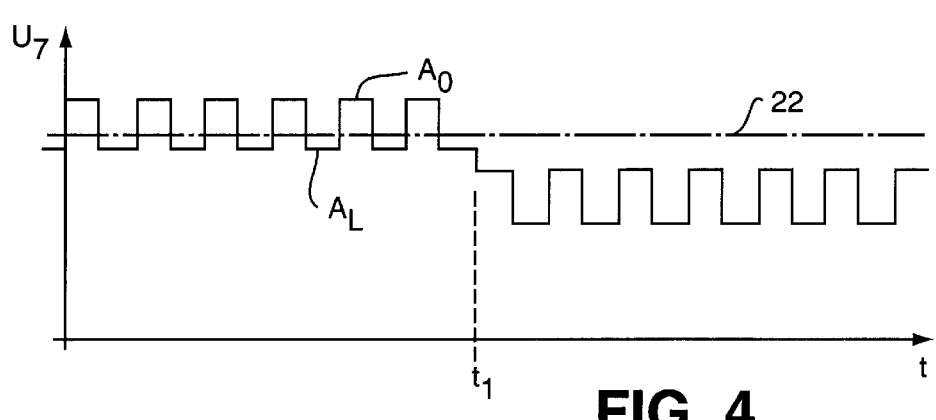

Voltage-conversion circuit 2 serves to superimpose the fed-in DC voltage $U_2$ with the square-wave voltage 8, which is also fed in at control input 6, so that a voltage $U_7$ appears at output 7, the temporal course of which is shown in FIG. 4. In this instance, a DC voltage is used that fluctuates back and forth between an upper amplitude value $A_O$ and a lower amplitude value $A_L$ in the cycle of the supplied square-wave voltage 8. As illustrated in FIG. 4, the values of $A_O$ and $A_L$ are both greater than zero and correspond to the upper and lower limit values 19 and 21, respectively, between which the DC voltage $U_2$ to be monitored may permissibly move.

Additionally, FIG. 4 includes a dashed line 22 that indicates the switching threshold of comparator 3, which coincides in amount and operational sign with the reference voltage defined with voltage $U_1$. Since it was assumed at the outset that $U_2$ has the nominal value up to time $t_1$, the output voltage $U_7$ subsequently generated by voltage-conversion circuit 3 fluctuates continually about the reference voltage specified by $U_1$, i.e., the upper amplitude value $A_O$ exceeds the reference voltage, while the lower amplitude value $A_L$ lies below the switching threshold. Accordingly, comparator 3 generates the square-wave voltage $U_{15}$ illustrated at output 15 in FIG. 5, which voltage constantly jumps back and forth between zero and $U_B$ up to time $t_1$. Thus, up to time $t_1$, output 16 of voltage converter 4 is acted upon by a unipolar square wave, which the converter converts into the system-foreign voltage $U_A$ via the method to be described below.

At time $t_1$, an error may occur that allows voltage $U_2$ to break down to value $U_{2error}$, which is smaller than the lower voltage-limit value 21. Due to this error, the upper and lower amplitude values $A_O$ and $A_1$ shift from $U_7$ toward smaller amounts. The distance between the upper amplitude value $A_O$ and the lower amplitude value $A_1$ remains essentially the same due to the special embodiment of voltage-conversion circuit 2 described in greater detail below. However, now the upper amplitude value $A_O$ is correspondingly smaller than threshold value 22 of voltage comparator 3. Output voltage $U_7$ is smaller than reference value 22, even with the upper amplitude value $A_O$, after the occurrence of the error, that is, after $t_1$. Hence, output 15 of voltage comparator 3 remains at zero after time $t_1$.

If, at time $t_1$, voltage $U_2$ were not to become smaller than the lower voltage limit 21, but rather larger than the upper voltage limit 19, then voltage $U_7$ would be shifted upward after time $t_1$ such that the lower amplitude value $A_O$ would be larger than switching threshold 22. Voltage comparator 3 would subsequently also supply a continuous voltage approximately at $U_B$ at its output 15.

Figure 5:
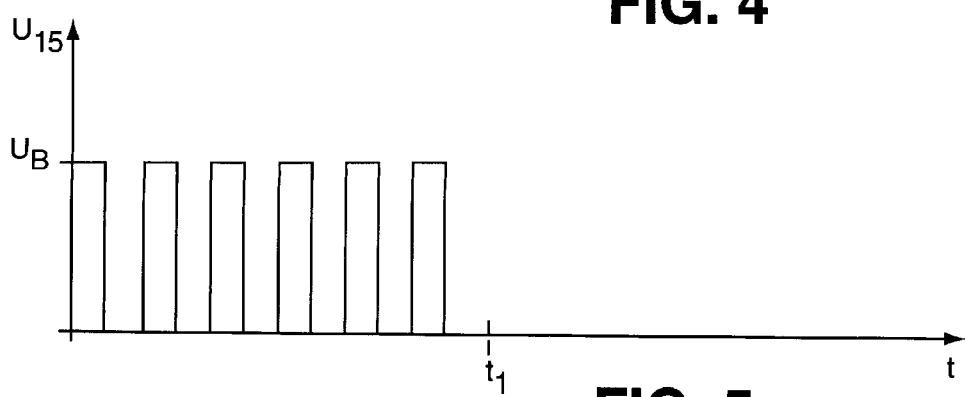

Only as long as $U_2$ is between the two limit voltages 19 and 21 does voltage comparator 3 generate the unipolar square-wave voltage, shown to the left of $t_1$ in FIG. 5, at its output 15. If the upper or lower voltage limit values 19 and 21 are transgressed, continuous DC voltages arise at output 15, which voltages are either zero or equal to $U_B$, depending on whether the upper tolerance limit 19 or the lower tolerance limit 21 is transgressed.

Based on the aforementioned description of the function of the apparatus shown in FIG. 1, the lower amplitude value $A_O$ of voltage $U_7$ also corresponds to the upper voltage limit value 19, while the upper amplitude value $A_O$ corresponds to the lower limit voltage 19. Consequently, switching threshold 22 is closer to the lower amplitude value $A_1$ if the tolerance field for $U_2$ above the nominal value is narrower than the tolerance field for the lowest allowable limit voltage. The explanation provided reveals an additional characteristic of the novel apparatus. Namely, the reference voltage can be formed from $U_2$, while the voltage $U_1$ represents the voltage to be monitored. In this case, the square-wave voltage would be superimposed over the reference voltage; as a result, the upper amplitude value $A_O$ corresponds to the upper limit voltage 19 and the lower amplitude value $A_O$ corresponds to the lower limit voltage 21.

FIG. 6 shows a simplified circuit diagram for generating voltage $U_1$, and of voltage-conversion circuit 2, with supply voltage $U_B$ representing the voltage to be monitored.

From voltage $U_B$, voltage $U_1$ is generated through the connection of output 11 of voltage comparator 3 to supply voltage $U_B$ via a resistor 25. Additionally, a Zener diode 26 is switched from inverting input 11 to circuit ground 13. In this way, voltage $U_1$, or the reference voltage, being essentially independent within wide limits of the size of supply voltage $U_B$, is supplied to inverting input 11. For example, the size of supply voltage $U_B$ is 5 V, which is customary for supplying digital circuits. Based on this assumption, the characteristic voltage of Zener diode 26 would be 2.5 V, i.e., the reference voltage has the value 2.5 V.

Voltage-conversion circuit 2 comprises an inverter 27, whose input 28 is connected to control input 6. Inverter 27 is connected to circuit ground 13 by means of a connection 29, while another current-supply input 14 is connected to supply voltage $U_B$, which is to be monitored. Inverter 27 is formed, for example, from a C-MOS-NAND element, whose inputs are switched in parallel and represent input 28. These types of C-MOS-NAND elements comprise a counter-clock stage, formed from two NPN transistors 31 and 32 connected in series, with the junction between the collector of transistor 32 and the emitter of transistor 3 representing the output connection 33 of inverter 27. The further components of inverter 27 are not shown in detail, because they are not otherwise significant for understanding the method of operation of the circuit. Furthermore, the structure of this type of C-MOS element can be looked up in any data catalog desired.

A voltage divider comprising resistors 34 and 35 is in parallel to supply voltage $U_B$, the junction between the two resistors 34 and 35 represents output 7 of voltage-conversion circuit 2. A further resistor 36 is connected to output 7, the other end of which resistor is connected to output 33 of inverter 27.

In addition to the aforementioned assumption that supply voltage $U_B$ is 5 V, it is also assumed that the maximum allowable supply voltage $U_B$ is 5.5 V, and the minimum allowable supply voltage may be 4.5 V. Under these conditions, both resistors 34 and 35 are of equal size.

If square-wave voltage 8 is fed into control input 6, then transistor 31 or transistor 32 is alternately completely turned on, while the respective other transistor is completely blocked. Consequently, output 33 is either connected to circuit ground 13 by means of current-supply connection 29, or to supply voltage $U_B$ by means of current-supply connection 27, because the cascade comprising the two transistors 31 and 32 lies between supply voltage $U_B$ and circuit ground 13. Regarding further circuit dimensions, it is simply assumed that the conduction voltage of both transistors 31 and 32 is minuscule. Under these conditions, resistor 36 must be approximately 5.12 times larger than resistor 35 or resistor 34, as ensues from the condition discussed below.

Depending on the switching state of the two transistors 31 and 32, resistor 36 is in parallel to either resistor 34 or resistor 35. Since the reference voltage is half as large as supply voltage $U_B$, and supply voltage $U_B$ can fluctuate between the limit values of 5.5 as the upper value and 4.5 as the lower value, the upper and lower amplitude values of voltage $U_1$ must be between 2.75 and 2.25 V, respectively, if supply voltage Us has a nominal value of 5 V.

As long as voltage $U_B$ remains less than 5.5 V, but greater than 4.5 V, voltage-conversion circuit 2 generates a voltage at output 7 that continually fluctuates about the reference value of 2.5 V. If voltage $U_B$ becomes greater than 5.5 V, then voltage $U_7$ no longer fluctuates between 2.25 V and 2.75 V, but the lower amplitude value $A_L$ increases to 2.51 V if resistor 36 is approximately 5.12 times larger than resistors 34 and 35, as assumed above. Accordingly, the reverse occurs if voltage $U_B$ falls below the lowest allowable limit value, in which instance voltage comparator 3 would supply a continuous signal outside of one of the two limit values of 4.5 and 5.5 V, respectively, as described in detail above. Only as long as $U_B$ is between the specified limits does voltage comparator 3 generate the necessary square-wave signal at its output 15.

In the explanation of the embodiment, it was indicated that voltage comparator 3 has a switching hysteresis going counter to zero. If voltage comparator 3 should have a switching hysteresis, the upper and lower amplitude values must be corrected accordingly until the function described above is achieved.

For the specific embodiment illustrated in FIG. 6, voltage-conversion circuit 2 operates as a 'weak' adder in that, as the voltage is generated via the two resistors 34 and 35, an additional voltage is added or subtracted via resistor 36.

FIG. 7 shows an embodiment in which voltage $U_2$ represents the reference voltage that enters voltage-conversion circuit 2. Inverting input 11 of voltage comparator 3 lies at the junction between two resistors 38 and 39 switched in series, of which one is connected to circuit ground 13 and the other to supply voltage $U_3$. The two resistors 38 and 39 may be of equal size and thus generate voltage $U_1$ that is half as large as $U_B$.

Voltage-conversion circuit 2 thus includes an inverter 41, which comprises a NOR element having an open-collector output this time, i.e., inverter 41 comprises only an output transistor 42, whose emitter is connected to current-supply input 29 and thus to circuit ground 13, and whose collector represents output 33. Input 28 of inverter 41 is thus control input 6, while the positive supply-voltage connection 14 represents input 5, to which supply voltage $U_B$ is connected. A resistor 43 leads from input 5 within voltage-conversion circuit 2 to output 7, which is connected to circuit ground 13 by means of the series connection of a Zener diode 44 and diode 45 poled in the direction of flux. Output 33 is connected at the junction between Zener diode 44 and diode 45.

Diode 45, poled in the direction of flux, normally generates a voltage drop of 0.6 V if it is flowed through by current in the direction of flux. Under this assumption, Zener diode 44 is selected so as to generate a voltage drop of 2.1 V.

As soon as square-wave voltage 8 is fed into control input 6, transistor 42 is opened or closed in the cycle of square-wave voltage 8. In the open condition, it short-circuits diode 45, while in the blocked condition, diode 45 generates a voltage drop, which adds to the voltage drop of Zener diode 44. The voltage at output 7 thus switches between 2.7 and 2.1 V. So that voltage comparator 3 can generate the square-wave voltage at its output 15 under these conditions, supply voltage $U_B$ must be lower than 5.4 V but greater than 4.2 V. Furthermore, the described and dimensioned circuit is suitable for monitoring supply voltage $U_B$ while maintaining these limit values.

Nevertheless, it is certainly possible to provide other dimensioning. It would also be plausible to use the stabilizing circuit according to FIG. 6, comprising resistor 25 and Zener diode 26, instead of the voltage divider comprising the two resistors 38 and 39, so that inverting input 11 obtains the reference voltage again, while Zener diode 44 is replaced by an ohmic resistor so that the base point of the voltage divider now comprising two resistors is switched between two different potentials with the aid of diode 45. This also permits the desired voltage to be generated at output 7 in order to achieve the aforementioned function. The only essential point here is that voltage-conversion device 2 supplies a voltage at output 7 that jumps between an upper and a lower amplitude value $A_O$, $A_L$, respectively, and that both of these values correspond to an upper and a lower voltage limit value of the other voltage to be monitored. The dimensioning must be selected such that, if the other voltage to be monitored leaves the range defined by these two limiting values, comparator 3 supplies a continuous signal, instead of an AC signal, at its output.

FIG. 8 shows the fundamental block diagram for voltage converter 4 used in the novel apparatus for generating the system-foreign voltage. A "system-foreign" voltage is defined as a voltage that is greater or lower than the largest or smallest supply voltage occurring in the circuit with regard to amount and operational sign, or which is galvanically-separated from the supply voltage. For the aforementioned embodiment, system-foreign voltages would be voltages greater than 5.5 V or less than 0 V, if these voltages are galvanically-connected to the monitored circuit.

The voltage converter shown in FIG. 8 is intended to generate a voltage larger than 5.5 V. In its input, it contains a NAND element 49 having two inputs 49 and 51, as well as an inverting output 52. Input 49 simultaneously forms input 16 of voltage converter 4.

A capacitor 53, whose other electrode is connected via a diode 54 to supply voltage $U_B$, is connected to inverting output 52. Another diode 55 leads from the junction between diode 55 and capacitor 53 to a filter or smoothing capacitor 56, which is connected at the other end to circuit ground 13. Output 17 of voltage converter 4 is connected at the junction between diode 55 and capacitor 56.

A feedback loop leading from output 17 to the other input 51 of NAND element 48 is provided for preventing voltage converter 4 from starting up again in the event of an AC voltage interruption at its input 16. This feedback loop comprises an OR element 59 having two inputs 61 and 62 and whose output 58 is connected to input 51. Input 61 is connected by means of a voltage divider, formed by two resistors 63 and 64, to output 17. The other end of the voltage divider is connected to reference ground 13.

To keep voltage converter 4 blocked after a switch-off process, input 62 is switched to circuit ground 13 via a resistor 65, in addition, input 62 is the enable or release input.

Voltage converter 4 described thus far operates as follows:

If voltage comparator 3 provides the output AC voltage according to FIG. 5, because the voltages $U_1$ and $U_2$ to be compared to each other are identical with regard to the allowable tolerance field, input 49 of NAND element 48 is periodically acted on by a signal varying between "high" and "low". If the other input 51 is on "high", then the level at inverting output 52 correspondingly varies between "high" and "low". In the "low" state, capacitor 53 is charged to the supply voltage via diode 54 poled in the direction of flux. If inverting output 52 then changes to "high" and thus has a voltage corresponding to supply voltage $U_B$, the voltage stored in capacitor 53, which is as large in amount as $U_B$, is added to the voltage at inverting output 52. Diode 54 is now prestressed in the blocked direction, since the junction between capacitor 53 and the cathode of diode 54 now has a voltage approximately twice as large as $U_B$. Smoothing capacitor 56 is charged with this voltage via diode 55. Following a few of these charging cycles, capacitor 56 supplies a smoothed DC voltage twice the size of $U_B$. The DC voltage also is present at input 17, and thus represents the required system-foreign voltage, which is evaluated in other control circuits, e.g., in a central CPU.

In addition, the voltage at output 17 is again halved to $U_B$ at the voltage divider comprising resistors 63 and 64, and supplied to input 61. Although the other input 62 is at "low" via resistor 65, output 58 goes to "high". This signal is fed to input 51. Voltage converter 4 is thus capable of continuous function, until the AC signal is interrupted for a sufficient length of time at its input, i.e., until capacitor 56 is sufficiently discharged via the voltage divider comprising resistors 63 and 64 that the "high" signal at input SI disappears. If this has occurred, voltage converter 4 no longer generates the required voltage at its output 17 to generate the AC signal if voltage comparator 3 should restart. Only a release at release input 62 due to a "high" signal permits voltage converter 4 to restart operation.

The system-foreign voltage can also be generated with the help of a T flip-flop 68 having open-collector outputs, as can be seen in FIG. 9. A clock input 69 of the T flip-flop is connected to input 16 of voltage converter 4, while a push-pull transformer 73 is connected to two complementary outputs 71 and 72 of T flip-flop 68. Transformer 73 includes a centrally-tapped primary winding 74, whose central tap 75 is connected to supply voltage $U_B$ as well as a secondary winding 76, which is connected to AC-voltage connections of a bridge rectifier 77. The negative connection of bridge rectifier 77 is likewise connected to the potential of supply voltage $U_B$, and the positive output of bridge rectifier 77 represents output 17 of voltage converter 4.

If the T flip-flop is a negative edge-triggered flip-flop, it changes its state each time there is a negative edge emitted at output 15 by voltage comparator 3, so that outputs 71 and 72 switch periodically in the cycle of the fed-in AC voltage, the two outputs 71 and 72 being in antiphase with respect to one another. In primary winding 74, a corresponding current is consequently generated in each partial winding, which current results in a voltage in secondary winding 76. The voltage generated at the galvanically-separated winding 76 acts rectified in bridge rectifier 77 and, because the bridge rectifier is connected to supply voltage $U_B$ with its negative connection, the voltage emitted by bridge rectifier 77 is the sum of voltage $U_B$ plus the voltage present at secondary winding 76.

The voltage at output 17 thus also represents a system-foreign voltage, as long as clock input 69 of the T flip-flop obtains an AC-voltage signal.

In contrast, if the AC signal fails, the voltage in secondary winding 76 also disappears, and voltage $U_A$ at output 17 becomes correspondingly smaller, which can be evaluated by the next circuit.

Figure 10:
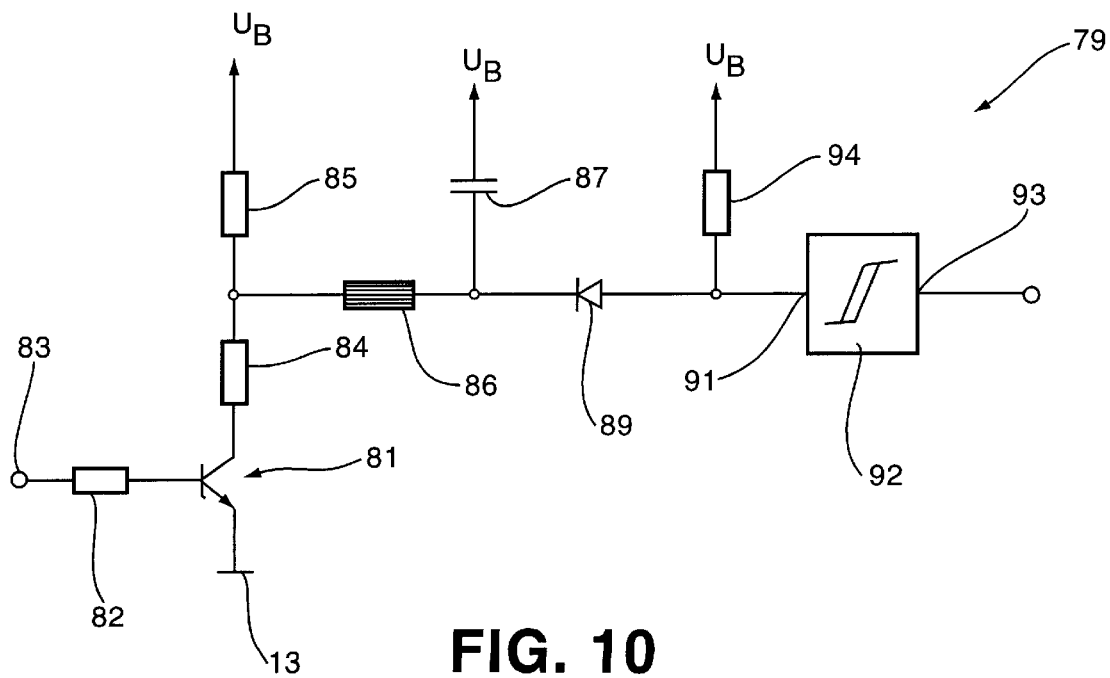

If, in the interest of a higher safety level, voltage converter 4 must not be permitted to become operational due to stray AC voltages, for example, from a faulty power supply, or as a result of oscillating integrated circuits, despite a dropout of the AC voltage at output 15 of voltage comparator 3, another frequency discriminator 79 can be used, as shown in FIG. 10. Frequency discriminator 79 comprises a transistor 81 on the input side, the base of which is connected via a resistor 82 to a discriminator input 83. The emitter of transistor 81 is connected to circuit ground 13, while the collector receives supply voltage $U_B$ via the series connection of two resistors 84 and 85. A series resonant circuit comprising an inductive resistor 86 and a capacitor 87 is connected at the junction of the two resistors 84 and 85, and connected at the other end to supply voltage $U_B$. A diode 89 goes out from the junction between inductive resistor 86 and capacitor 87, and leads to an input 91 of a Schmitt-trigger 92 on the anode side, whose output 93 is the output of frequency discriminator 79. Input 91 is connected to supply voltage $U_B$ via a resistor 94 in order to generate an average bias voltage for Schmitt-trigger 92.

Input 83 is connected to output 15 of voltage comparator 3 in order to monitor the frequency at output 15. The AC signal generated there enters transistor 81, which stimulates the series resonant circuit comprising components 86 and 87. The natural frequency of this series resonant circuit is matched to the clock frequency of square-wave signal 8, so that a signal level that is in position to control Schmitt-trigger 92 only appears at the anode of diode 89 if the frequency of square-wave signal 8 corresponds sufficiently to the natural frequency. If the frequencies differ too greatly from one another, there is no longer a resonance step-up at capacitor 87, and the voltage is not sufficient to periodically reverse Schmitt-trigger 92. The lack of an AC signal at output 93 of Schmitt-trigger 92 indicates that square-wave signal 8 is either missing entirely or has a frequency that does not coincide with the natural frequency of the series resonant circuit comprising capacitor 87 and inductive resistor 86. Through monitoring of the signal at output 93, it can be ensured that system-foreign voltage $U_A$ is only viewed as an indicator that the comparison of the two voltages $U_1$ and $U_2$ has been positive if the AC signal appears simultaneously at output 83.

In one practical embodiment, resistors 84 and 85 as well as the resonant circuit elements are dimensioned such that, with resonance, the voltage at the cathode of diode 89 has a peak-to-peak value of 10 V, with an average value of +5 V.

A further monitoring option is to connect frequency discriminator 79, as shown in FIG. 10, into the connecting line between output 15 of voltage comparator 3 and input 16 of voltage converter 4.

An apparatus for comparing two DC voltages comprises a voltage comparator having two inputs. One of the two voltages to be compared is fed directly into one of the inputs. The other voltage enters a voltage-conversion device, in which the voltage to be compared is superimposed by an AC voltage, so that a DC voltage that fluctuates back and forth periodically between an upper and a lower amplitude value in the cycle of the square-wave signal arises at the output of the voltage-conversion device. The difference between the two amplitude values corresponds to the tolerance band within which the two voltages to be compared must be identical. The voltage signal obtained from the voltage-conversion circuit enters the other input of the voltage comparator, which only delivers an AC signal at its output if the upper amplitude value is larger and the lower amplitude value is smaller than the DC signal fed into the other input of the comparator.

The AC signal obtained from the comparator enters a voltage converter, which generates a system-foreign voltage from the signal.

We claim:

1. An apparatus for comparing a first DC voltage ($U_1$) with a second DC voltage ($U_2$), having a comparator (3) provided with two inputs (9, 11) with the first DC voltage ($U_1$) being applied to the first input (11), having a voltage-conversion device (2) provided with a control input (6), into which an AC signal (8) is fed, a signal input (5), into which the second DC voltage ($U_2$) is fed, and an output (7) connected to the second input (9) of the comparator (3), wherein the voltage conversion device, when the voltages are applied to the inputs (5, 6), provides a voltage ($U_7$) that periodically fluctuates between an upper amplitude value ($A_O$) and a lower amplitude value ($A_L$), with the difference between the two amplitude values ($A_O$, $A_L$) being essentially equal to a specified difference value.

2. The apparatus as defined in claim 1, characterized in that the voltage-conversion device (2) is formed from a summation device in which an AC voltage (8) is added to a voltage derived from the second DC voltage ($U_2$).

3. The apparatus as defined in claim 1, characterized in that the second DC voltage ($U_2$) has a nominal value, that a voltage value between the upper and lower amplitude values ($A_O$, $A_L$) is equal to the first DC voltage ($U_1$) when the second DC voltage ($U_2$) is at its nominal value, and that the specific difference value corresponds to the allowable tolerance range of the second DC voltage ($U_2$).

4. The apparatus as defined in claim 1, characterized in that means (34, 35; 38, 39) are provided that derive a voltage from a supply voltage ($U_B$), with the derived voltage being at least essentially proportional to the supply voltage ($U_B$) or its change being essentially proportional to a change in the supply voltage ($U_B$), and that the derived voltage forms one of the DC voltages ($U_1$, $U_2$).

5. The apparatus as defined in claim 1, characterized in that means (26, 44) are provided that derive a voltage from supply voltage ($U_B$), with the derived voltage being at least essentially independent of supply voltage ($U_B$) and forming an essentially fixed reference voltage that represents one of the two DC voltages ($U_1$, $U_2$).

6. The apparatus as defined in claim 5, characterized in that the reference voltage is independent of the supply voltage ($U_B$).

7. The apparatus as defined in claim 1, characterized in that the AC signal (8) is a square-wave signal.

8. The apparatus as defined in claim 1, characterized in that at least one ohmic resistor (34, 43) is included between the signal input (5) and the output (7) of the voltage-conversion device (2).

9. The apparatus as defined in claim 1, characterized in that at least one element having the characteristic of a Zener diode is included between the signal input (5) and the output (7) of the voltage-conversion device (2).

10. The apparatus as defined in claim 1, characterized in that at least one element (44, 45) having the characteristic of a Zener diode is included between the output (7) of the voltage-conversion device (2) and a ground (13) common to the device and the comparator (3).

11. The apparatus as defined in claim 1, characterized in that at least one ohmic resistor (35) is included between the output (7) of the voltage-conversion device (2) and a ground (13) common to the device and the comparator (3).

12. The apparatus as defined in claim 1, characterized in that the voltage-conversion device (2) includes at least one electronic switch (31) via which an additional voltage is switched periodically to the output (7) of the voltage-conversion device (2).

13. The apparatus as defined in claim 1, characterized in that the voltage-conversion device (2) includes at least one electronic switch (42), by way of which a two-terminal network (45) in parallel to the electronic switch (42) is periodically short-circuited.

14. The apparatus as defined in claim 1, characterized in that the comparator (3) is connected to the output (7) of the voltage-conversion device (2).

15. The apparatus as defined in claim 14, characterized in that the comparator (3) has an output (15), wherein a voltage converter (4) connected to the output (15) generates a voltage ($U_A$), which represents a system-foreign voltage.

16. The apparatus as defined in claim 15, characterized in that the system-foreign voltage is a voltage galvanically-separated from a monitored voltage ($U_9$).

17. The apparatus as defined in claim 15, characterized in that the system-foreign voltage is a voltage greater or less than a monitored voltage ($U_B$) with regard to amount and operational sign.

18. The apparatus as defined in claim 15, characterized in that the voltage converter (4) is a voltage multiplier formed from capacitors (53, 56) and diodes (54, 55).

19. The apparatus as defined in claim 15, characterized in that the voltage converter (4) comprises an isolating transformer (73).

20. The apparatus as defined in claim 19, characterized in that an output winding (76) of the isolating transformer (73) is connected to a rectifier (77).

21. The apparatus as defined in claim 20, characterized in that a monitored voltage ($U_B$) is in series connection with the voltage supplied by the rectifier (77).

22. The apparatus as defined in claim 1, characterized in that it comprises a frequency detector (79) into which an AC signal is fed and which emits an output signal at its output (93).

23. The apparatus as defined in claim 22, characterized in that the AC signal is the output signal of the comparator (3).

24. The apparatus as defined in claim 22, characterized in that the frequency detector comprises a series resonant circuit (86, 87), whose natural frequency essentially coincides with the base frequency of a clock signal, and that the junction of the elements (86, 87) of the series resonant circuit is connected to the output (93) of the frequency detector (79).

* * * * *